United States Patent [19]

Addis et al.

[11] Patent Number: 4,731,588
[45] Date of Patent: Mar. 15, 1988

[54] GAIN SELECTABLE AMPLIFIER WITH RESONANCE COMPENSATION

[75] Inventors: John L. Addis, Beaverton; Clifford E. Baker; Patrick A. Quinn, both of Aloha, all of Oreg.

[73] Assignee: Tektronix, Inc., Beaverton, Oreg.

[21] Appl. No.: 918,412

[22] Filed: Oct. 14, 1986

[51] Int. Cl.[4] ............................................. H03F 3/45
[52] U.S. Cl. ..................................... 330/254; 330/259
[58] Field of Search ............... 330/254, 259, 260, 304, 330/80

[56] References Cited

U.S. PATENT DOCUMENTS 4,646,036  2/1987  Brown ................................. 330/284

Primary Examiner—Gene Wan
Attorney, Agent, or Firm—George T. Noe; Mark L. Becker

[57] ABSTRACT

A resonance compensated unity voltage gain amplifier comprises an input stage and an output stage connected in feedback to the input stage and a series resonance circuit for compensating for the resonance of the output and input stages created by the feedback. Reactance of the series resonance circuit is adjusted to be substantially zero at the resonant frequency of the amplifier. The resonance compensated amplifier is incorporated into a gain selectable amplifier. The resistance on the output stage of the amplifier across which the input voltage is applied via the output voltage may be selectively varied to change the current gain of the amplifier.

12 Claims, 3 Drawing Figures

GAIN SELECTABLE AMPLIFIER WITH RESONANCE COMPENSATION

FIELD OF THE INVENTION

This invention generally relates to feedback amplifiers. More particularly, this invention relates to circuitry for compensating for oscillation and instability associated with such amplifiers at high frequencies.

BACKGROUND OF THE INVENTION

The unity gain buffer amplifier is a feedback amplifier that provides unity voltage gain at its output. The unity gain buffer is commonly used in many applications because of its superior characteristics. These characteristics include a relatively low output impedance and high input impedance, gain stability with respect to temperature, and an improved linearity.

This amplifier, as any feedback amplifier, suffers from a tendency to oscillate at higher frequencies. The simplest and most common method of compensating for oscillation is to reduce the bandwidth of the amplifier by adding capacitance. The capacitance introduces a dominant pole within the amplifier to force the phase shift of the gain to be less than $-180°$ and thus the phase margin to be greater than $0°$ when the loop gain T is unity. This addition will satisfy the Nyquist criterion for stability. However, the trade-offs in amplifier performance are considerable. For one, the frequency capability of the amplifier is sacrificed. For another, the introduced phase margin causes peaking in the overall gain at the resonant (unity loop gain) frequency of the amplifier. The smaller the phase margin, the larger the gain peak becomes until the gain approaches infinity and oscillation occurs for a phase margin of $0°$. For a third reason, increasing the capacitance to increase the phase margin lowers the slew rate of the amplifier. The lower the slew rate, the longer the amplifier takes to respond to a large input signal.

The need to preserve stability is especially important in gain selectable amplifiers, where the current gain can be varied upon command. Such amplifiers may be stable at one level of current gain and yet be unstable at another level because of the change in feedback caused by changing resistance therein. The change in feedback within the amplifier affects the peaking of the gain at the resonant frequency.

SUMMARY OF THE INVENTION

An object of the invention, therefore, is to improve the stability of a unity gain amplifier without sacrificing bandwidth.

A second object of the invention is to compensate for the gain peaking of the amplifier.

A third object of the invention is to provide a simple means for determining the required compensation.

A fourth object of the invention is to provide compensation that minimizes the effect of slew rate on the performance of the amplifier.

A fifth object of the invention is to provide compensation that can be designed into an integrated circuit.

Still another object of the invention is to provide such compensation for a selectable gain amplifier.

To achieve these objects, a resonance compensated amplifier is disclosed herein. The amplifier includes a differential input stage for receiving the input signal and an output stage for amplifying the signal. The output voltage of the output stage is fed back to the input stage to cause the output voltage to match the input signal voltage. Instability in the amplifier created by the feedback is compensated for by a series resonance circuit, the reactance of the circuit adjusted to be substantially zero at the resonant (unity loop gain) frequency of the amplifier.

In one embodiment of the invention, the series resonance circuit comprises an inductor-resistor-capacitor branch coupled between the input and output stages of the amplifier, the value of the capacitor minimized by the addition of the inductor. In another embodiment of the invention, the inductor is a transistor connected in series with the capacitor and the resistor, the collector of the transistor coupled to the capacitor and resistor, the base coupled to the collector through a biasing base resistor and the emitter coupled to the input and output stages. The resistance of the base resistor is adjusted according to a conventional formula to provide in combination with the transistor an inductive reactance. This reactance is combined with the reactance of the capacitor to be substantially zero at the amplifier's resonant frequency.

Means are further disclosed for adjusting the current gain of the amplifier by varying the resistance across which the output voltage is applied.

The foregoing and other objects, features, and advantages of the invention will become more apparent from the following detailed description of a preferred embodiment which proceeds with reference to the accompanying drawings.

DETAILED DESCRIPTION

Figure 1:
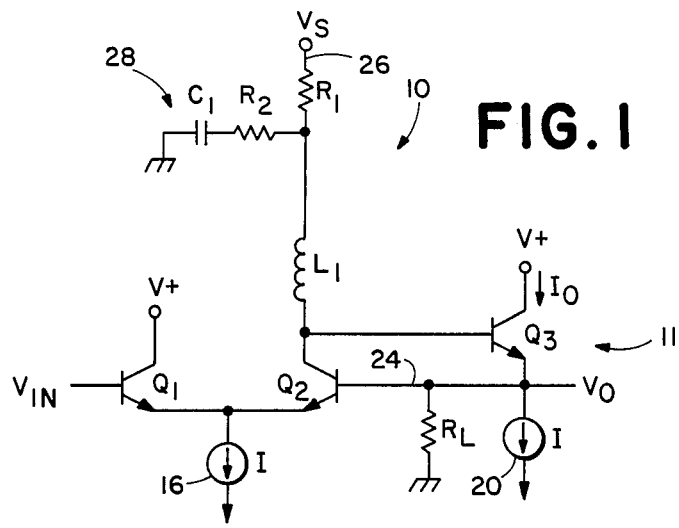
FIG. 1 is a schematic diagram of a first embodiment of a compensated amplifier according to the invention.

Referring to FIG. 1, a resonance compensated amplifier 10 embodying the invention is shown. The compensated amplifier includes a unity gain buffer 11 having a differential input stage for receiving an input signal and an output stage for providing an output signal $V_o$ with unity voltage gain. The differential input stage comprises a pair of emitter-coupled transistors $Q_1$, $Q_2$ biased by a conventional current source 16. The transistors $Q_1$ and $Q_2$ are matched so that equal currents are drawn by the current source 16 from each transistor when the voltages at each base are equal.

Coupled to the collector of transistor $Q_2$ is an output stage such as a transistor $Q_3$. Transistor $Q_3$ provides at its emitter an output voltage $V_o$ Biasing current source 20 biases $Q_3$. $V_o$ is applied across resistor $R_L$ connected to the emitter of the transistor $Q_3$ to control the amount of current $I_o$ drawn through its collector.

As can be seen in FIG. 1, transistor $Q_3$ is basically an emitter follower connected in feedback to the differential input stage. As an emitter follower, it would provide about unity voltage gain at its emitter (less the voltage drop across the base emitter junction) and substantial current gain if no feedback were present in the buffer 11. Its performance is improved, however, by applying $V_o$ to the base of transistor $Q_2$ along a feedback path 24. At the base, $V_o$ is compared by the input stage against the input signal voltage $V_{in}$ on the base of transistor $Q_1$. If $V_{in}$ exceeds $V_o$, the base emitter voltage across transistor $Q_2$ decreases, causing the transistor to draw less current from current source 26 formed by a resistor $R_1$ and voltage source $V_s$. The drop in current drawn into the collector of transistor $Q_2$ raises the voltage at the base of transistor $Q_3$ and via the base-emitter junction raises $V_o$. If $V_{in}$ drops below $V_o$, on the other hand, the opposite result occurs. The voltage across the base emitter junction of transistor $Q_2$ increases, causing more current to be drawn from current source 26. The increased current lowers the voltage at the base of transistor $Q_3$ and via the base-emitter junction lowers $V_o$ as well. $V_o$ therefore changes to match $V_{in}$ as $V_{in}$ varies.

This feedback, although it improves the linearity of the buffer 11, introduces a tendency for it to oscillate at high frequencies because of the phase shift that feedback causes in the overall gain. According to the Nyquist criterion, oscillation will occur at radian frequency $\omega_o$ if the phase margin is 0° or less when the loop gain T is one. This frequency $\omega_o$ is a function of the parameters of the buffer 11 such as the transconductance, output admittance, input impedance, parasitic capacitances, and resistances, etc. With these values known or estimatable, $\omega_o$ is readily determined by simulating the performance of the unity gain buffer 11 on SPICE or a similar circuit simulation program. At this frequency, the output signal $V_o$ of the buffer 11 will "resonate" or oscillate independently of $V_{in}$.

To compensate for the effect of feedback on buffer 11, a series resonance circuit 28 is coupled between the output and input stages of the buffer 11. In FIG. 1, the circuit 28 comprises a capacitor $C_1$, resistor $R_2$, and inductor $L_1$ connected in series. The value of the capacitor $C_1$ is chosen to be large enough to introduce sufficient phase margin via movement of a pole to prevent oscillation and yet as small as possible to preserve maximum bandwidth. This value can be determined from the parameters of the buffer 11 by calculation or more easily from SPICE. The peaking that results at the unity gain frequency $\omega_o$ as observed on a Bode plot is then reduced by the addition of inductance through inductor $L_1$, which is chosen to provide a zero at the resonant frequency to cancel the corresponding pole of the capacitor. This inductor also improves the slew rate of the buffer 11 by effectively increasing the capacitive effect without increasing the capacitance. The value of resistor $R_2$ is chosen to match the gain peak at or near the resonant frequency. It effectively counters the magnitude of the gain peak at resonance. Its value can be calculated but is more easily determined through observation on SPICE of its effect on the gain peak. With all three element values chosen properly, the gain peaking should be removed at the resonant frequency and replaced by a smooth roll-off on the Bode plot.

Figure 2:
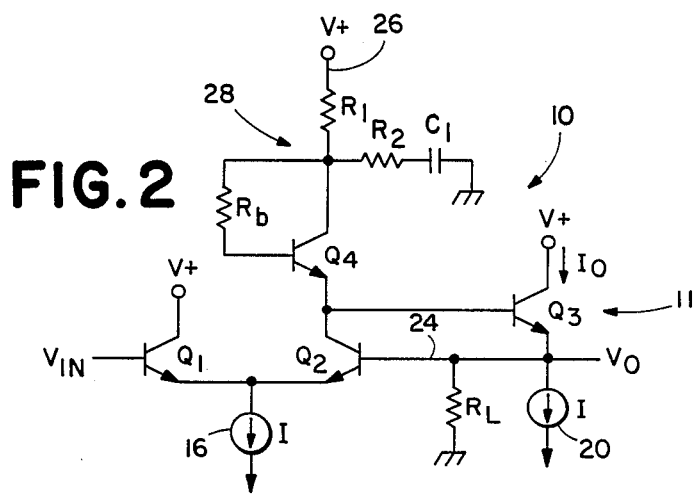
FIG. 2 is a schematic diagram of a second embodiment of the compensated amplifier.

Fabricating of an inductor such as $L_1$ in an integrated circuit, however, is difficult. FIG. 2 shows in place of the inductor $L_1$ transistor $Q_4$ biased through a base resistor $R_b$. Using a technique well known in the integrated circuit art, transistor $Q_4$ and resistor $R_b$ are chosen to provide an inductance according to the following formula:

$$L = R_b/2\pi f_T$$

where $f_T$ is the transition frequency of the transistor, the frequency at which the magnitude of the short circuit, common emitter current gain falls to unity.

Figure 3:
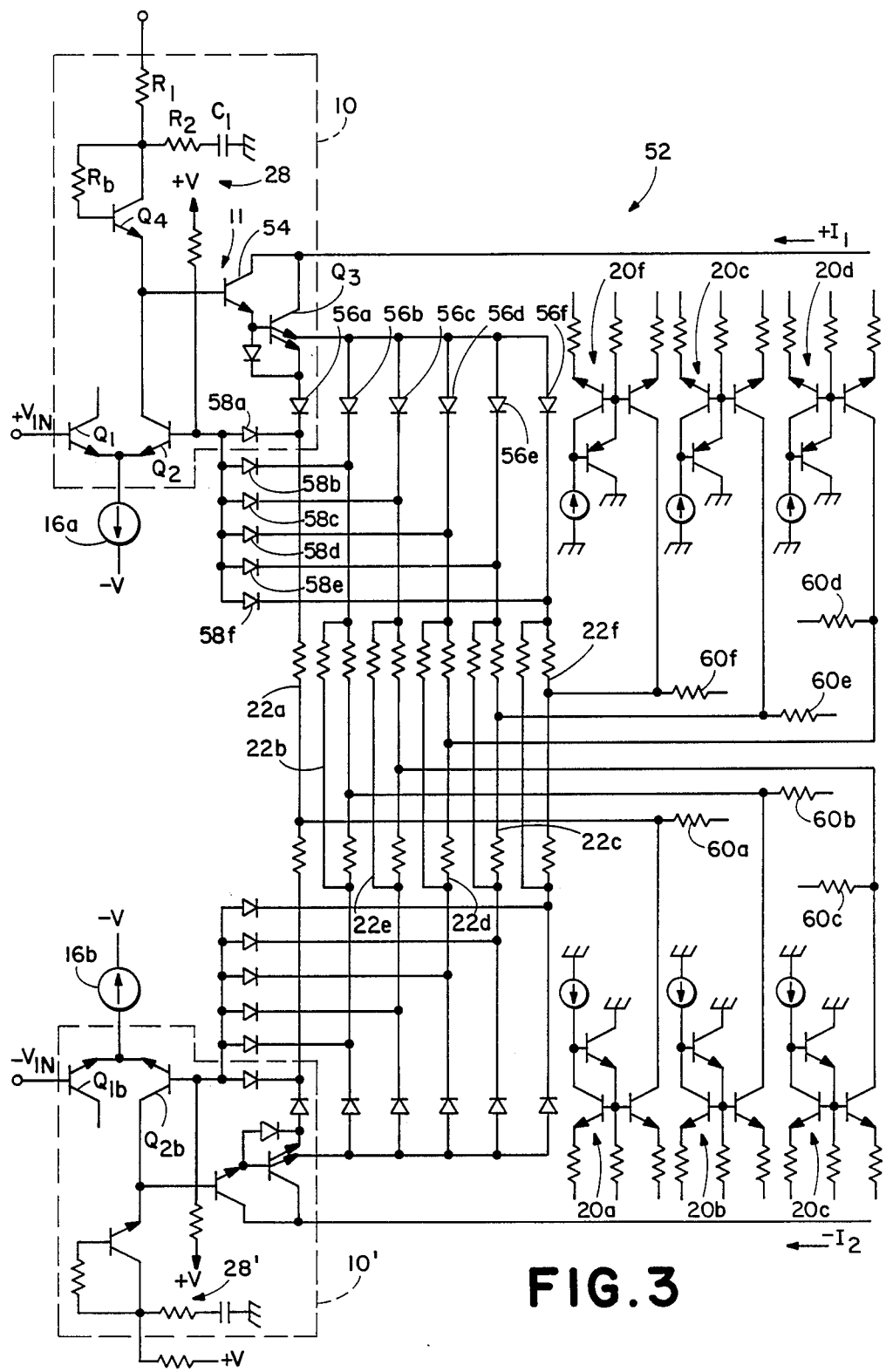
FIG. 3 is a schematic diagram of a selectable gain amplifier embodying the compensated amplifier of FIG. 2.

FIG. 3 shows the compensated amplifier 10 in combination with a variable load resistance to create a selectable current gain amplifier 52. Two compensated amplifiers 10 and 10' are shown because of the use of a differential input signal in this particular embodiment. In this amplifier 10, the output current $I_o$ on the collector of transistor $Q_3$ is linearly proportional to $V_{in}$. An additional transistor 54 has been added to $Q_3$ in a Darlington configuration to boost the current gain of the amplifier 10 at the collector of $Q_3$.

In place of a single emitter resistor, a resistive network having branches 22a through 22f is connected to the emitter of $Q_3$. The resistance decreases from branch 22a to 22f. Each resistive branch is connected to an independent biasing current source 20a through 20f, at least one of which is selected to be active at a time by an input signal (not shown). The resistive branches are isolated from each other by diodes 56a through 56f and 58a through 58f and a voltage applied by an associated voltage source 60a through 60f when the respective source is switched off. The selectable current source 20a through 20f and the resistive network form a means for adjusting the gain of the amplifier 10 according to the following equation:

$$I_o = V_o/R_L = V_{in}/R_L$$

where $R_L$ is the resistance of the branch selected. By selecting a specific current source, the resistance on $Q_3$ across which $V_{in}$ is applied via $V_o$ may be selectively varied to change the current gain of the amplifier. The current gain of $Q_3$ is therefore inversely proportional to the load resistance coupled to the emitter across which $V_{in}$ is applied.

Amplifier 52 is shown with inputs for receiving a differential signal. If a time differential signal is receive $V_o$ is applied across half of the branch resistance. If one of the signal inputs is ground, then $V_o$ is applied across the entire branch.

Two biasing current sources are shown connected to the emitter-coupled transistors $Q_1$, $Q_2$ of the differential input stage. Source 16a is activated to bias the input stages when any of the resistive branches 22b through 22f are selected. However, source 16b is selected when branch 22a is selected because of the change in the amount of feedback produced by the higher resistance. The emitters coupled to source 16b include emitter degeneration resistors for reducing the open loop gain of the amplifier 10, thereby preserving its stability.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. A resonance compensated feedback amplifier, comprising:

a differential input stage for receiving an input signal voltage;

an output stage coupled to the differential input stage to provide a voltage gain to the input signal voltage; and a series resonance circuit coupled across the input and output stages for compensating for the resonance of the amplifier created by the feedback, the reactance of the series resonance circuit adjusted to counter gain peaking at the resonant frequency of the amplifier.

2. The amplifier of claim 1 in which the reactance of the series resonance circuit is zero at the resonant frequency of the amplifier.

3. The amplifier of claim 1 in which the series resonance circuit comprises a series resistor-capacitor-inductor circuit coupled across the input and output stages.

4. The amplifier of claim 1 in which the series resonance circuit comprises a transistor in series with a capacitor and resistor, the transistor having its collector coupled to the series capacitor and resistor and its emitter coupled to the input and output stages and a base resistor connecting its collector and base, the resistance of the base resistor selected so that the transistor and base resistor provide an inductance that is combined with the reactance of the capacitor to be zero at the resonant frequency of the amplifier, the inductance determined by $$L = R_b/2\pi f_T$$

where $f_T$ is the transition frequency of the transistor.

5. The amplifier of claim 1 in which the differential input stage comprises a pair of emitter-coupled transistors and the output stage comprises an output transistor, the first transistor receiving at its base the input signal voltage and the second transistor receiving at its base the output voltage fed back from the emitter of the output transistor, the output transistor connected at its base to the collector of the second transistor.

6. A resonance compensated feedback amplifier, comprising:
  a pair of emitter-coupled transistors forming a differential input stage, a first transistor of the emitter-coupled pair receiving at its base an input signal voltage;
  an output transistor to provide unity voltage gain, the transistor having its base coupled to the collector of a second transistor of the emitter-coupled pair and its emitter coupled to the base of the second transistor to feedback the output voltage to the differential input stage to cause the output voltage to match the input signal voltage; and
  a series resonance circuit comprising capacitive and inductive elements coupled across the input stage and output transistor for compensating for the resonance of the emitter-coupled transistors and output transistor created by the feedback, the reactance of the series resonance circuit adjusted to counter gain peaking at the resonant frequency of the amplifier.

7. A gain selectable feedback amplifier, comprising:
  a differential input stage for receiving an input signal;
  an output stage coupled to the differential input stage to provide current gain to the input signal, an output voltage of the output stage fed back to the differential input stage to cause the output voltage to match the input signal;
  a resistive network coupled to the output stage; and
  means for adjusting the gain of the amplifier by varying the resistance of the resistive network.

8. The amplifier of claim 7 including a series resonance circuit coupled across the input and output stages for compensating for the resonance of the input and output stages created by the feedback, the reactance of the series resonance circuit adjusted to be substantially zero at the resonant frequency of the amplifier.

9. The amplifier of claim 7 in which the resistive network comprises a plurality of resistive elements, each of a different resistance.

10. The amplifier of claim 9 further comprising a selecting means having a plurality of current sources, each connected to one of the resistive elements, at least one of the current sources being active to provide gain.

11. A gain selectable amplifier with resonance compensation, comprising:
  a pair of emitter-coupled transistors forming a differential input stage, a first transistor of the emitter-coupled pair receiving at its base an input signal voltage;
  an output transistor providing current gain at its collector and unity voltage gain at its emitter, the base of the output transistor coupled to the collector of the second transistor of the emitter-coupled pair and the emitter of the output transistor coupled to the base of the second transistor to feed back the output voltage to the differential input stage to cause the output voltage to match the input signal voltage;
  a series resonance circuit comprising capacitive and inductive elements for compensating for the resonance of the emitter-coupled transistor and the output transistor created by feedback, the reactance of the series resonance circuit adjusted to be substantially zero at the resonant frequency of the amplifier;
  a resistive network of resistive elements coupled to the emitter of the output transistor for selectively setting the current gain of the output transistor; and
  a plurality of current sources, each source coupled to a separate resistive element, for selecting the resistance to be applied to the output transistor emitter by activating at least one current source.

12. The amplifier of claim 11 in which the series resonance circuit comprises a transistor in series with a capacitor and resistor, the transistor having its collector coupled to the series capacitor and resistor and its emitter coupled to the input and output stages and a base resistor coupling its collector and base, the resistance of the base resistor selected so that the transistor and base resistor provide an inductance that is combined with the reactance of the capacitor to be zero at the resonant frequency of the amplifier, the inductance determined by $$L = R_b/2\pi f_T$$

where $f_T$ is the transition frequency of the transistor.

* * * * *